United States Patent
Oishi et al.

(10) Patent No.: US 7,134,775 B2
(45) Date of Patent: Nov. 14, 2006

(54) VEHICULAR HEADLAMP AND LIGHT-EMITTING MODULE THEREFOR

(75) Inventors: Kazutami Oishi, Shizuoka (JP); Kiyoshi Sazuka, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 127 days.

(21) Appl. No.: 10/769,990

(22) Filed: Feb. 3, 2004

(65) Prior Publication Data

US 2004/0240219 A1   Dec. 2, 2004

(30) Foreign Application Priority Data

Feb. 3, 2003   (JP)   ............ P.2003-025953

(51) Int. Cl.
*F21V 21/00* (2006.01)
*F21V 9/00* (2006.01)

(52) U.S. Cl. .................. 362/545; 362/231

(58) Field of Classification Search ............ 362/545, 362/487, 544, 543, 231, 800, 516, 307, 460, 362/465, 235, 259; 257/88, 98
See application file for complete search history.

(56) References Cited

U.S. PATENT DOCUMENTS

| | | | |
|---|---|---|---|
| 5,633,710 A * | 5/1997 | Kumra et al. | 362/460 |
| 6,250,788 B1 * | 6/2001 | Muller | 362/541 |
| 6,296,376 B1 * | 10/2001 | Kondo et al. | 362/310 |
| 6,520,669 B1 * | 2/2003 | Chen et al. | 362/545 |
| 6,565,247 B1 * | 5/2003 | Thominet | 362/545 |
| 6,601,980 B1 | 8/2003 | Kobayashi et al. | |
| 2004/0042212 A1 * | 3/2004 | Du et al. | 362/296 |

FOREIGN PATENT DOCUMENTS

| | | |
|---|---|---|
| JP | 6-10880 U | 2/1994 |
| JP | 10-21703 A | 1/1998 |
| JP | 2001-229719 A | 8/2001 |
| JP | 2002-21993 A | 8/2002 |

* cited by examiner

*Primary Examiner*—Sandra O'Shea
*Assistant Examiner*—Bao Q. Truong
(74) *Attorney, Agent, or Firm*—Sughrue Mion, PLLC

(57) ABSTRACT

A vehicular headlamp includes a first semiconductor light-emitting element for emitting visible light, a reflector having an optical center in the vicinity of the first semiconductor light-emitting element and forming at least a part of a light distribution pattern of the vehicular headlamp, and a second semiconductor light-emitting element, for emitting infrared light, which is disposed at a position different from that of the first semiconductor light-emitting element, and which emits infrared light to be reflected by the reflector.

20 Claims, 13 Drawing Sheets

VEHICULAR HEADLAMP AND LIGHT-EMITTING MODULE THEREFOR

CROSS-REFERENCE TO RELATED APPLICATIONS

Not applicable

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

BACKGROUND OF THE INVENTION

The present invention relates to a vehicular headlamp and a light-emitting module therefore.

Conventionally, it is known to monitor the area in front of a vehicle by using so-called night-vision apparatus, including an infrared camera. For example, as described in Japanese Laid-Open Patent Application No. 2001-229719, an infrared projector is mounted at the front of a vehicle. It also is known to provide a vehicular lamp which radiates infrared light using a light-emitting diode as a source, as described in Published Japanese Utility Model Application H6-10880.

However, use of an infrared projector leads to higher cost. Moreover, there are some cases where sufficient space cannot be secured to install the infrared projector.

SUMMARY OF THE INVENTION

Therefore, it is an object of the present invention to provide a vehicular headlamp and a light-emitting module that are capable of solving the aforementioned problem.

According to a first aspect of the present invention, a vehicular headlamp employed in a vehicle includes a first semiconductor light-emitting element for emitting visible light, a reflector having an optical center in the vicinity of the semiconductor light-emitting element and forming at least a part of a light distribution pattern of the vehicular headlamp by reflecting visible light, and a second semiconductor light-emitting element for emitting infrared light, the second element being positioned differently from the first element, the reflector also reflecting infrared light from the first element.

The inventive vehicular headlamp radiates visible light forwardly of the vehicle. The vehicular headlamp may include a sealing member made of a material that transmits visible light and infrared light, and which integrally houses and seals the first and second semiconductor light-emitting elements. The reflector reflects visible light and infrared light generally in the forward direction, with the infrared light reflected at a greater elevational angle than that of the visible light.

The reflector may be a mirrored surface which extends forwardly from the rear of the first semiconductor light-emitting element so as to cover the first element, and which reflects visible light forwardly of the vehicle. The second semiconductor light-emitting element may be disposed between the first semiconductor light-emitting element and a rear end of the reflector.

Further, the second semiconductor light-emitting element may be disposed farther from the optical center of the reflector than the first semiconductor light-emitting element.

According to a second aspect of the present invention, a light-emitting module includes a first semiconductor light-emitting element for emitting visible light to be used in a vehicular headlamp, a second semiconductor light-emitting element for emitting infrared light, and a sealing member which integrally houses and seals the first and second semiconductor light-emitting elements, and which is made of a material that transmits visible light and infrared light.

DETAILED DESCRIPTION OF THE EMBODIMENTS

Hereafter, the present invention will be explained with reference to several embodiments. These embodiments do not limit the present invention as set forth in the claims, and as will be clear from the following description, all combinations of the characteristics explained herein are not to be construed as essential to the invention.

Figure 1:
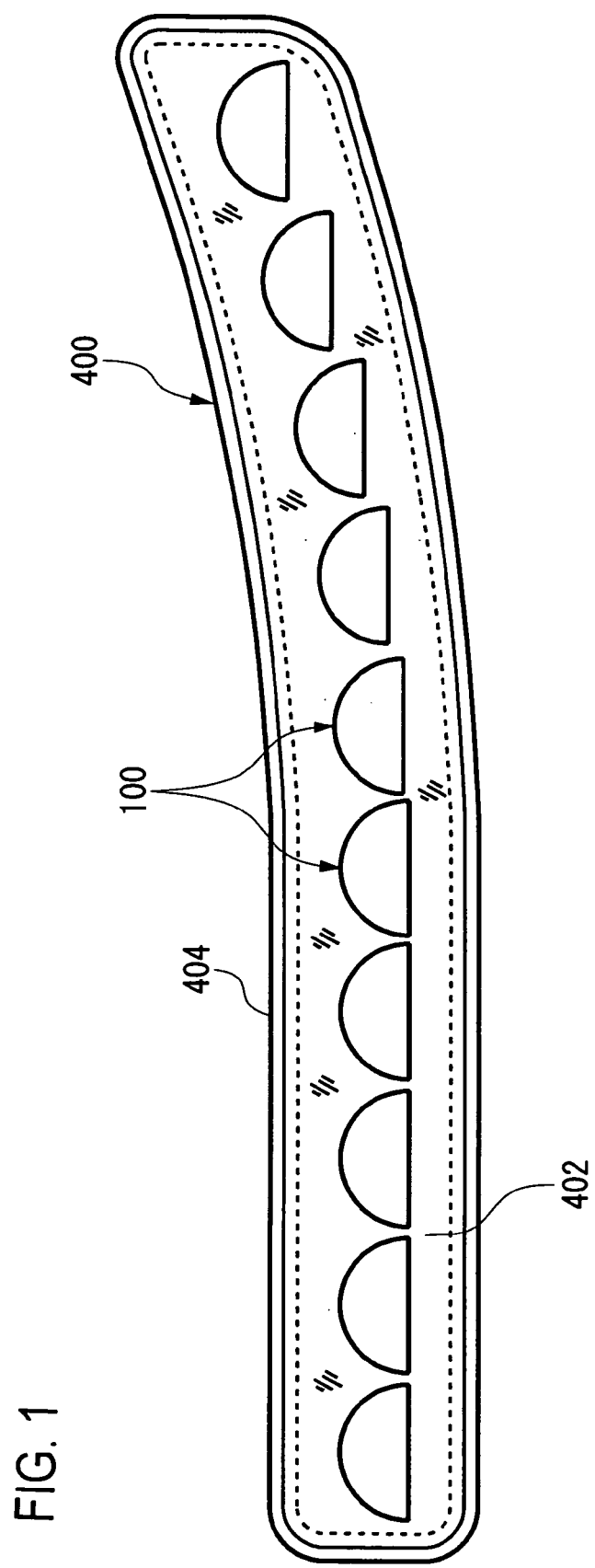
FIG. 1 is a drawing showing an example of a configuration of a vehicular lamp constructed according to a preferred embodiment of the present invention.

FIG. 1 shows an example of a vehicular lamp 400 constructed according to a preferred embodiment of the present invention. One goal of the vehicular lamp 400 is to radiate visible light and infrared light while providing a lamp having a low manufacturing cost. The vehicular lamp 400, which radiates a low beam, includes a plurality of light source units 100 housed in a substantially horizontal row in a lamp chamber formed by a substantially translucent and transparent cover 402 and a lamp body 404.

These light source units 100 have the same or similar configurations and are housed in the lamp chamber such that optical axes thereof are oriented downwardly by 0.3° to 0.6° with respect to the longitudinal direction when the vehicular lamp 400 is installed in the vehicle.

The vehicular lamp 400 radiates light from these light source units 100 forwardly of the vehicle and forms a predetermined light distribution pattern. Each of the light source units 100 may have different light distribution characteristics which contribute to that light distribution pattern. Alternatively, the vehicular lamp 400 may include a single light source unit 100 which produces the desired light distribution pattern.

Figure 2:
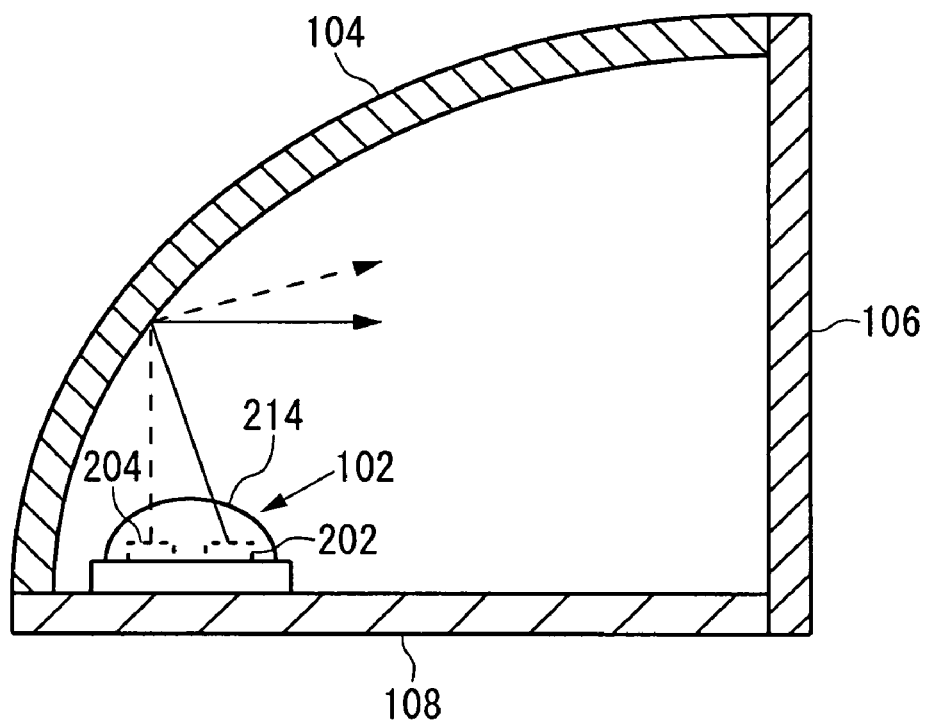
FIGS. 2 and 2A are drawings showing examples of a light source unit.

FIG. 2 shows an example of the light source unit 100, which is a parabolic light source unit which radiates light forwardly using a parabolic reflecting surface. The unit 100 includes a front cover 106, a bottom surface portion 108, a light source 102 and a reflector 104. The light source unit 100 radiates visible light and infrared light forwardly. In this embodiment, the visible light is white light to be used for ordinary illumination for the vehicular headlamp.

The bottom surface portion 108, which is substantially flat, is provided on a bottom surface of the light source unit 100. The light source 102 is provided on an upper surface of the bottom portion 108. The front cover 106, which is substantially transparent, covers the front face of the light source unit 100, transmits light reflected by the reflector 104 forwardly of the light source unit 100.

The light source 102 is a light-emitting diode module which has a first, visible light LED 202 and a second, infrared light LED 204 which emit visible light and infrared light respectively, and a sealing member 214 which houses and seals the two LEDs 202, 204. In this example, the infrared light LED 204 is disposed between the visible light LED 202 and a rear end of the reflector 104.

The reflector 104 is a mirrored surface which extends above and forwardly from the rear of the light source 102 to cover the light source 102. The reflector forms at least a part of the light distribution pattern of the light source unit 100 by reflecting visible light emitted by the visible light LED 202 in a forward direction.

The reflector 104 also reflects infrared light emitted by the infrared light LED 204 in the forward direction. In this example, the infrared light LED 204 is positioned more closely to the rear end of the reflector 104 than the visible light LED 202. Therefore, the portion of the reflector 104 that passes over the top of the light source 102 reflects infrared light to a higher elevation than it reflects the visible light.

With the foregoing construction, the light source unit 100 functions as an infrared projector which projects infrared light. As a result, it is possible to provide a highly advanced vehicular headlamp capable of radiating both visible light and infrared light at low cost. So equipped, a vehicle can utilize the infrared light for night-vision using an infrared light camera, or for detecting obstacles in front of the vehicle, among other uses.

The reflector 104 has its optical center, which is a focal point or an optical reference point or the like, in the vicinity of the visible light LED 202. In this case, the reflector 104 reflects visible light emitted by the visible light LED 202 quite accurately.

In one embodiment, the reflecting surface of the reflector 104 is parabolic so as to reflect incident light from the focal point as a substantially parallel light flux substantially in the optical axis direction.

Moreover, the infrared light LED 204 is farther from the focal point of the reflector 104 than is the visible light LED 202. Therefore, the reflector 104 radiates infrared light across a wider area than it radiates visible light.

In another embodiment, the light source unit 100 may be a projector type, which radiates, for example, light reflected and condensed close to the optical axis, forwardly through a lens. To perform this function, the reflector 104 may be a composite ellipsoid mirrored surface, for example. The reflecting surface of the reflector 104 may be formed with a generally ellipsoid spherical shape having one focal point and another focal point, for example, in the vicinity of the visible light LED 202 and in the vicinity of a front end of the bottom surface portion 108. With this structure, the reflector 104 will substantially condense light emitted by the light source 102 in the vicinity of the other focal point.

The light source unit 100 also may include, in place of the front cover 106, a lens which is disposed farther in front of a front end of the bottom surface portion 108, and which has a lens for which the other focal point serves as a focal point. Moreover, the front cover 106 which serves as a lens may form a cut-off line of the light distribution pattern based on the shape of the front edge. Also in this case, the light source unit 100 is capable of radiating infrared light. It should be noted that at least a part of a top surface of the bottom surface portion 108 also may reflect light.

Figure 3:
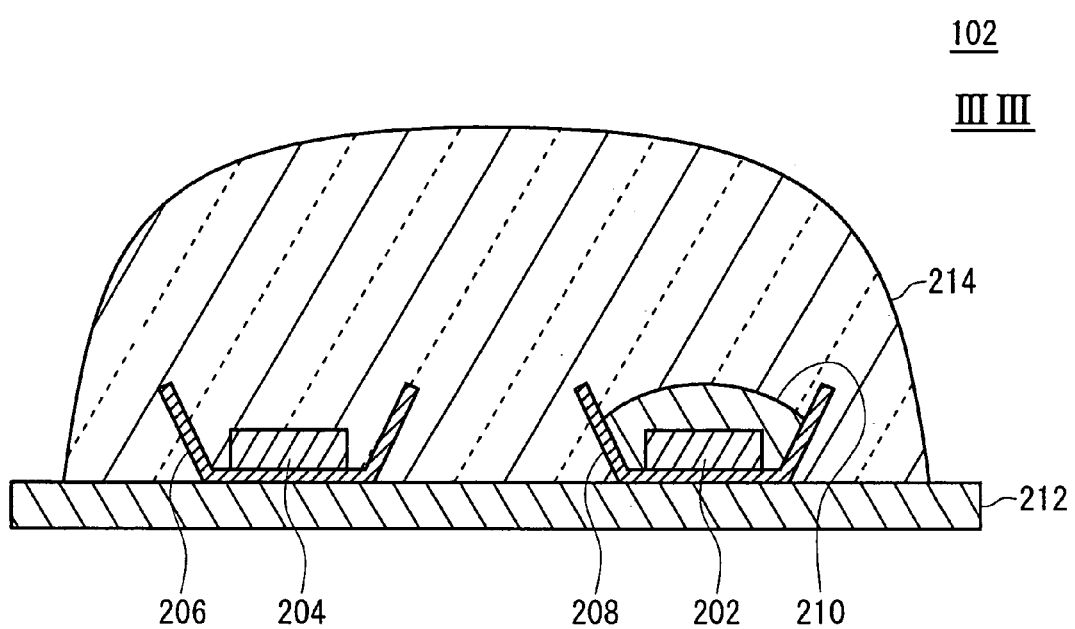
FIG. 3 is a drawing showing a vertical sectional view of a light source taken along a line III—III.
Figure 4:
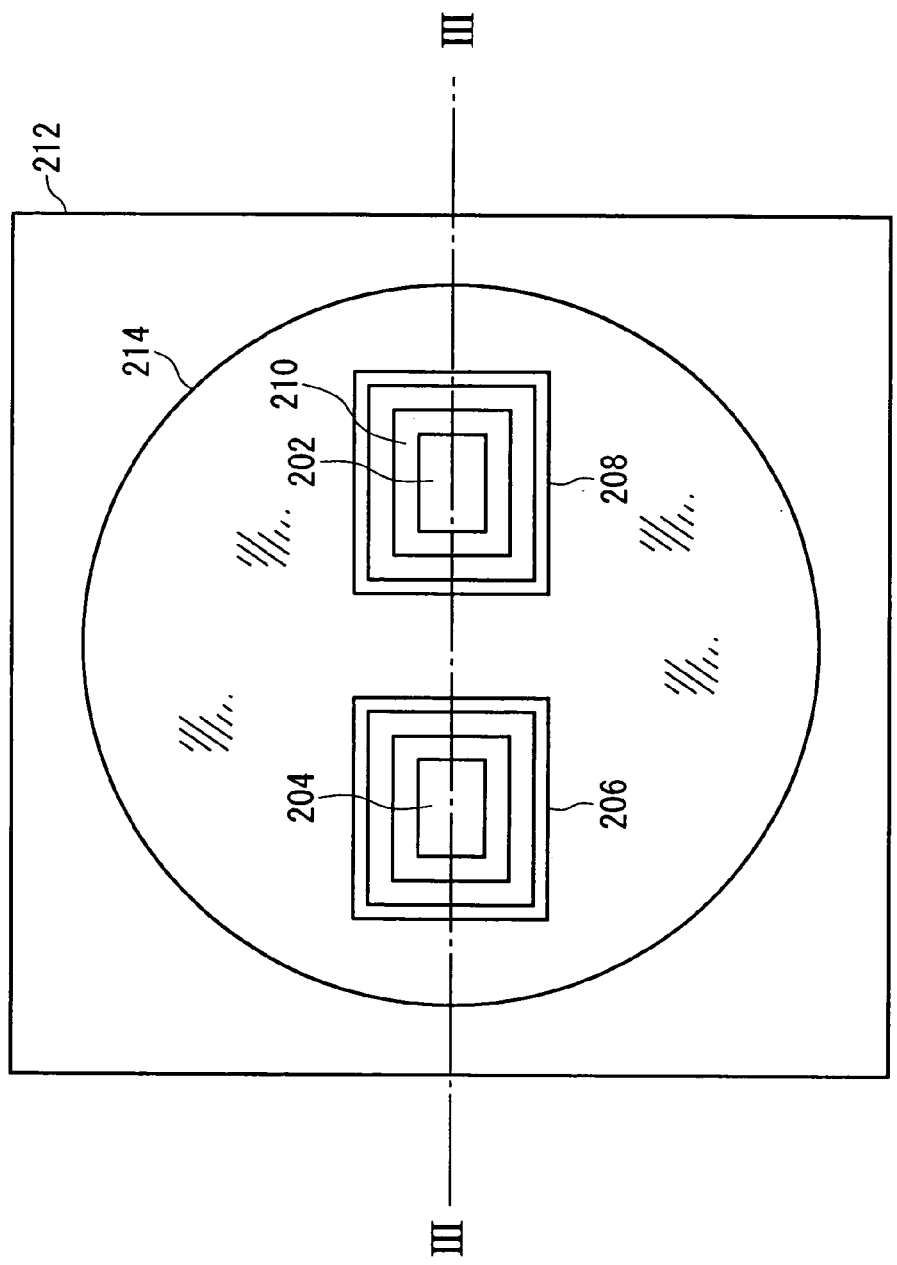
FIG. 4 is a drawing showing a top view of the light source also showing the line III—III.

FIGS. 3 and 4 show the configuration of the light source 102 in detail. FIG. 3 is a vertical sectional view of the light source 102 taken along the line III—III in FIG. 4. FIG. 4 is a top view of the light source 102.

The light source 102 is an example of a light-emitting module that includes the visible light LED 202, a fluorescent body 210, the infrared light LED 204, a visible light reflector 208, an infrared light reflector 206, a base board 212, and the sealing member 214.

The visible light LED 202 may be, for example, a semiconductor light-emitting diode that emits blue light or ultraviolet light. The fluorescent body 210, which is disposed between the visible light LED 202 and the sealing member 214, emits visible light to be used by the light source unit 100 (see FIG. 2) in accordance with the light emitted by the visible light LED 202. The fluorescent body 210 is disposed, for example, on the visible light LED 202 so as to generally cover the visible light LED 202. For example, the fluorescent body 210 may cover a part of the top surface of the visible light LED 202.

It should be noted that, in accordance with blue light emitted by the visible light LED 202, the fluorescent body 210 may emit amber light, which is a complementary color to blue light. In one embodiment, the light source 102 radiates white light based on blue light and yellow light emitted by the visible light LED 202 and the fluorescent body 210, respectively. The fluorescent body 210 may also emit white light in response to the ultraviolet light emitted by the visible light LED 202. In general, the fluorescent body 210 may have light transmission characteristics which are complementary to the characteristics of the light that the visible light LED 202 emits, so that what emerges from the fluorescent body 210 is substantially white light.

The infrared light LED 204 may be, for example, a semiconductor light-emitting element which emits infrared light as well as red light. The infrared light LED 204, which is disposed at a different position from that of the visible light LED 202, emits red light to be reflected by the reflector 104 (see FIG. 2).

The visible light LED 202 is mounted on the bottom surface of the visible light reflector 208. In one embodiment, the visible light reflector 208 extends upwardly and outwardly from the perimeter of its bottom surface. An inner wall surface formed by the reflecting surface surrounds the visible light LED 202 so as to reflect upwardly visible light, whereby light from the LED 202 stimulates the fluorescent body 210 to emit visible light. Accordingly, it is possible to utilize efficiently emitted visible light.

The visible light reflector 208 isolates the fluorescent body 210 disposed on the visible light LED from the infrared light LED 204. In this manner, it is possible to prevent infrared light emitted by the infrared light LED 204 from being absorbed by the fluorescent body 210.

The infrared light reflector 206, which has a function that is the same as or similar to that of the visible light reflector 208, reflects infrared light emitted by the infrared light LED 204 upwardly. Accordingly, it is possible to utilize efficiently the infrared light that has been emitted.

The base board 212 fixes the visible light LED 202 and the infrared light LED 204 at predetermined positions in that the visible light reflector 208 and the infrared light reflector 206 are secured to the upper surface of the base board 212. Further, the sealing member 214, which is formed of a material that transmits visible light and infrared light, integrally houses and seals the visible light LED 202 and the infrared light LED 204.

00461 If the visible light LED 202 and the infrared light LED 204 were installed on the light source unit 100 as individual LED modules, the necessary mounting space would increase and the configuration required for installation would be more complicated. However, in the embodiment described, since the visible light LED 202 and the infrared light LED 204 are housed integrally and are sealed by the sealing member 214, it is possible to install them easily in a limited space with a simple configuration.

Moreover, since a vehicular headlamp requires a highly accurate light distribution pattern, it is necessary to specify the positions of the visible light LED 202 and the infrared light LED 204 very accurately. Therefore, there are some cases when it is necessary to make the distance between the infrared light LED 204 and the visible light LED 202 smaller than the sizes of the infrared light LED 204 or the visible light LED 202. Also, in such a case, it is possible to specify the positions of the infrared light LED 204 and the visible light LED 202 very accurately, so that the light source unit 100 (see FIG. 2) can form an appropriate light distribution pattern.

It should be noted that in other embodiments, a single visible light reflector 208 may hold both the visible light LED 202 and the infrared light LED 204. As a result, it is possible to provide the visible light LED 202 and the infrared light LED 204 in a more limited space.

Figure 2A:
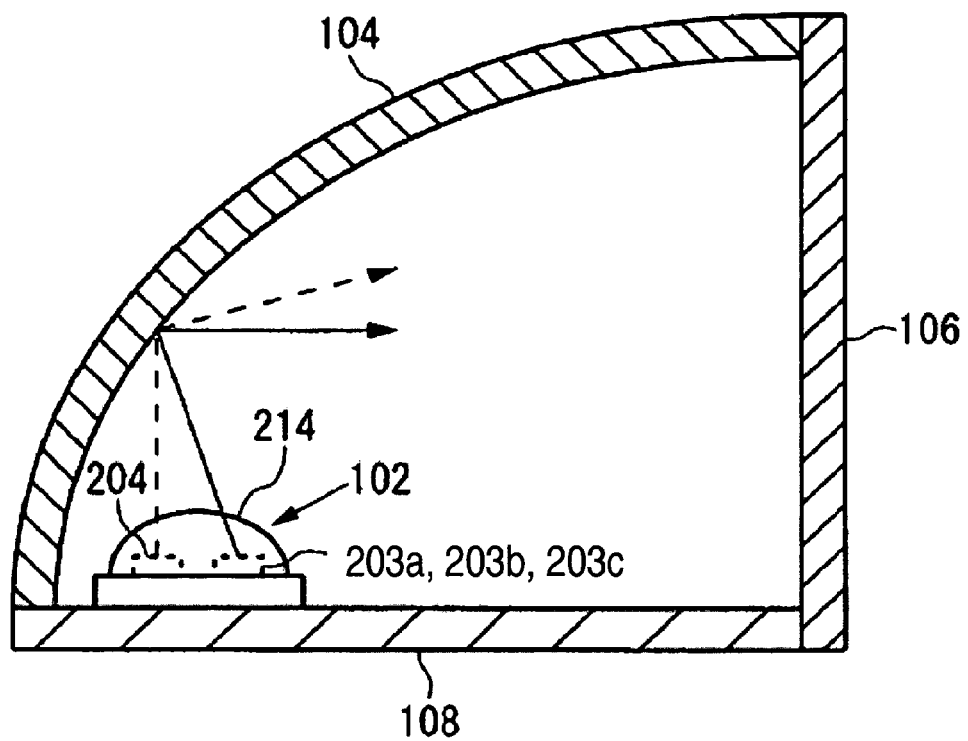

In other embodiments, in place of the visible light LED 202 and the fluorescent body 210, the light source 102 may include three types of semiconductor light-emitting elements 203a, 203b and 203c, which emit red, green, and blue light, respectively (see FIG. 2a). In this case, since there would be no fluorescent body 210 which can deteriorate over time, the light source 102 can last longer.

Figure 5:
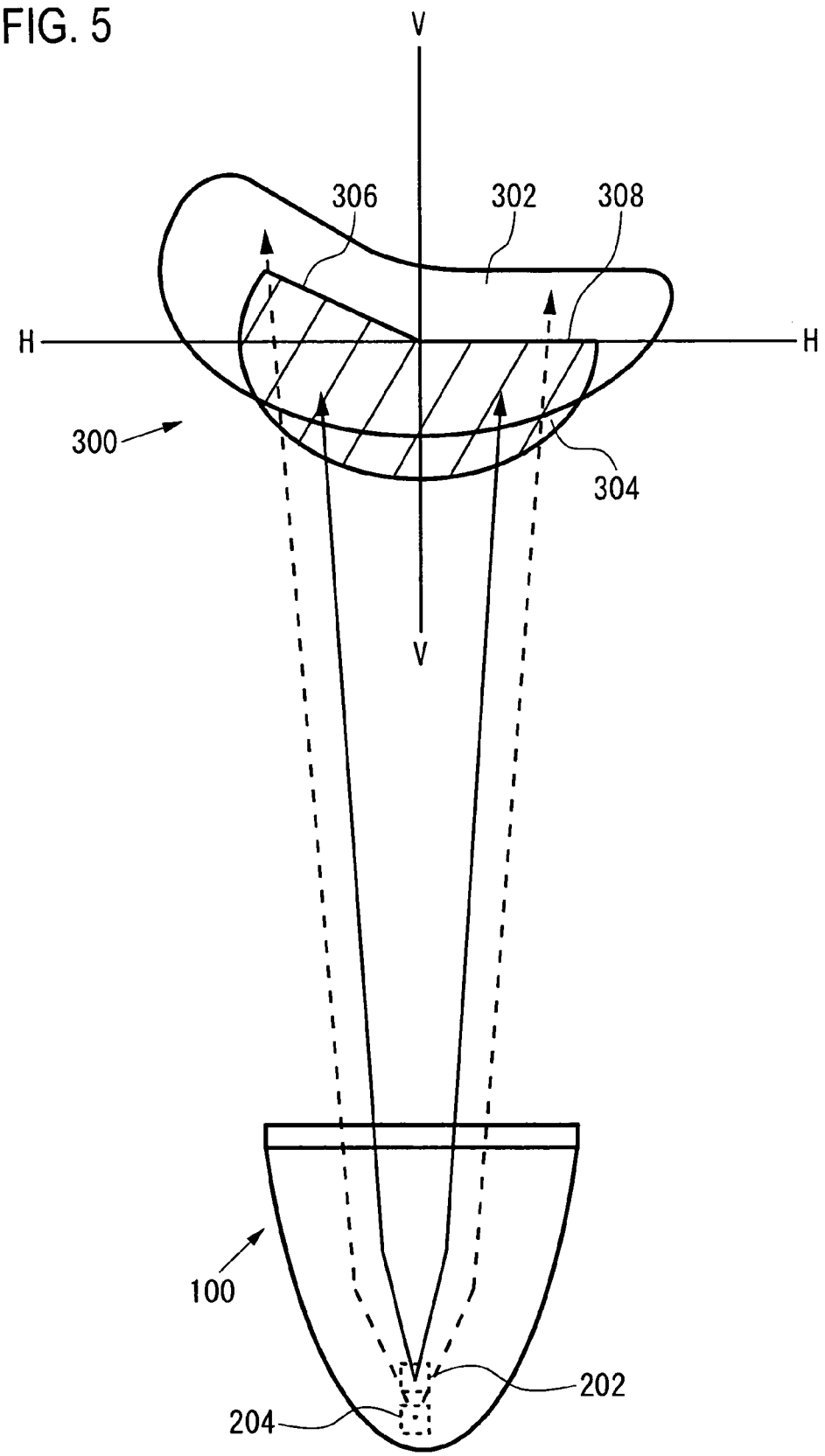
FIG. 5 is a drawing showing an example of a light distribution pattern formed by the light source unit.

FIG. 5 is a rear cross-sectional view showing the light source unit 100 and an example of a light distribution pattern 300 that the light source unit 100 forms. The light distribution pattern 300 is a low-beam light distribution pattern which is formed on a virtual vertical screen positioned 25 m ahead of the light source unit 100. In this example, the light source unit 100 forms a visible light pattern 304 formed by white light based on light emitted by the visible light LED 202, and an infrared light pattern 302 based on infrared light emitted by the infrared light LED 204.

In one embodiment, the light source unit 100 radiates visible light substantially forwardly of the vehicle so as to form the visible light pattern 304, which has an oblique cut-off line 306 and a horizontal cut-off line 308 that define a contrast boundary in the light distribution pattern. Further, as explained with reference to FIG. 2, in one embodiment, the reflector 104 reflects infrared light to a higher elevation than the visible light. Accordingly, the light source unit 100 forms the infrared light pattern 302 with a center at a higher elevation than that of the visible light pattern 304.

A conventional infrared light projector sometimes emits visible red light as well as red light in the infrared range. However, emission of red light is not desirable from a safety viewpoint, and is subject to regulatory control for vehicular headlamps.

However, in accordance with one aspect of the invention, the red light accompanying emission of infrared light is substantially diluted by white light in regions where the infrared light pattern 302 and the visible light pattern 304 overlap each other. Moreover, the infrared light LED 204 and the visible light LED 202 are adjacent to each other and are disposed in the same light source unit 100. Therefore, even in areas outside of the overlapping regions in the infrared light pattern 302, it is possible to make the red light accompanying emission of infrared light appear dim.

The infrared light LED 204 is farther from the focal point of the reflector 104 than is the visible light LED 202. Therefore, the infrared light pattern 302 spreads across a wider area than does the visible light pattern 304.

It should be noted that the vehicular lamp 400 (see FIG. 1) may form the light distribution pattern 300 based on, for example, light emitted by the plurality of light source units 100 having different light distribution characteristics. Each of the light source units 100 may radiate light to a part of the light distribution pattern 302.

Figure 6:
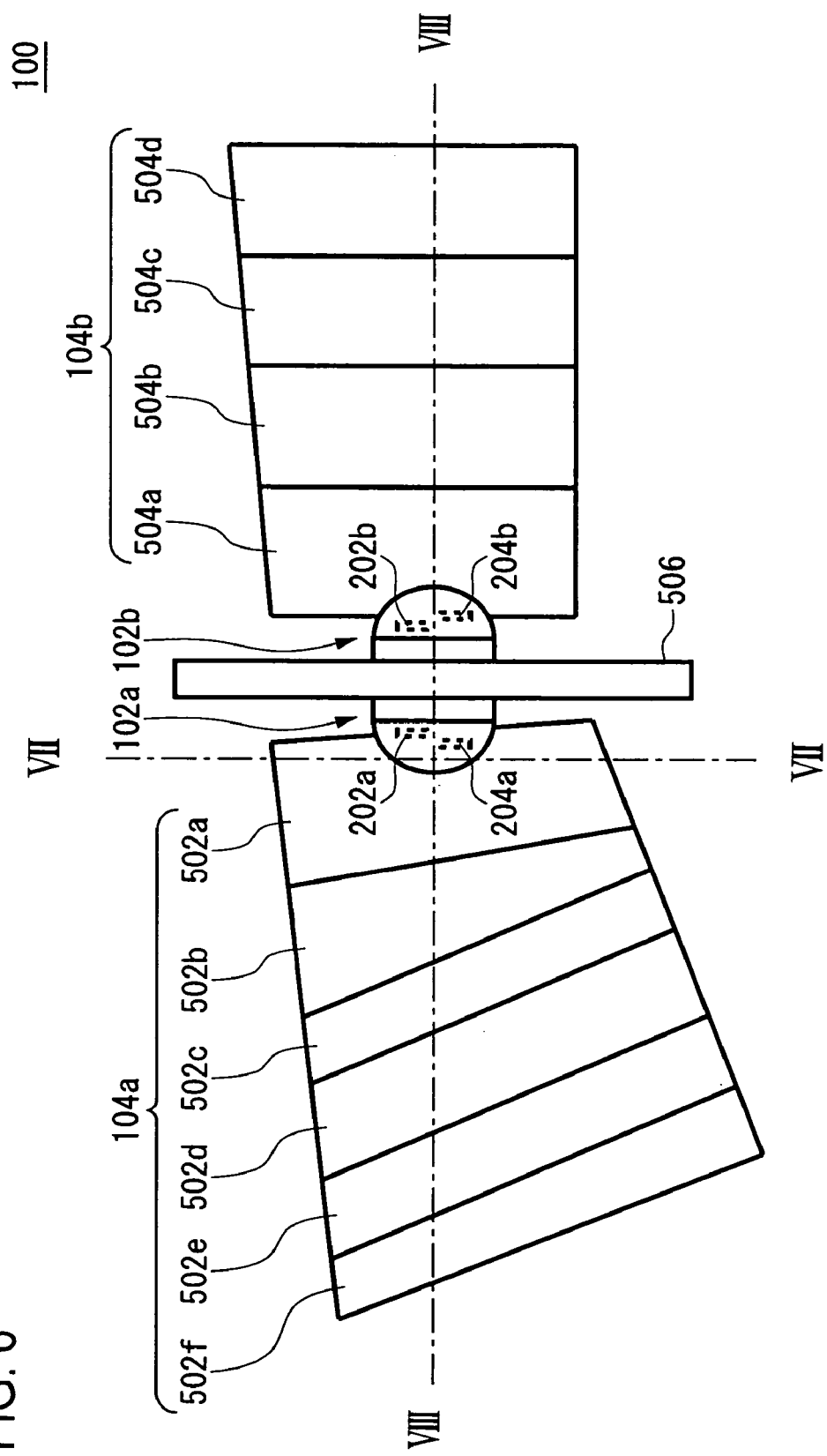
FIG. 6 is a drawing showing a front view of the light source unit.
Figure 7:
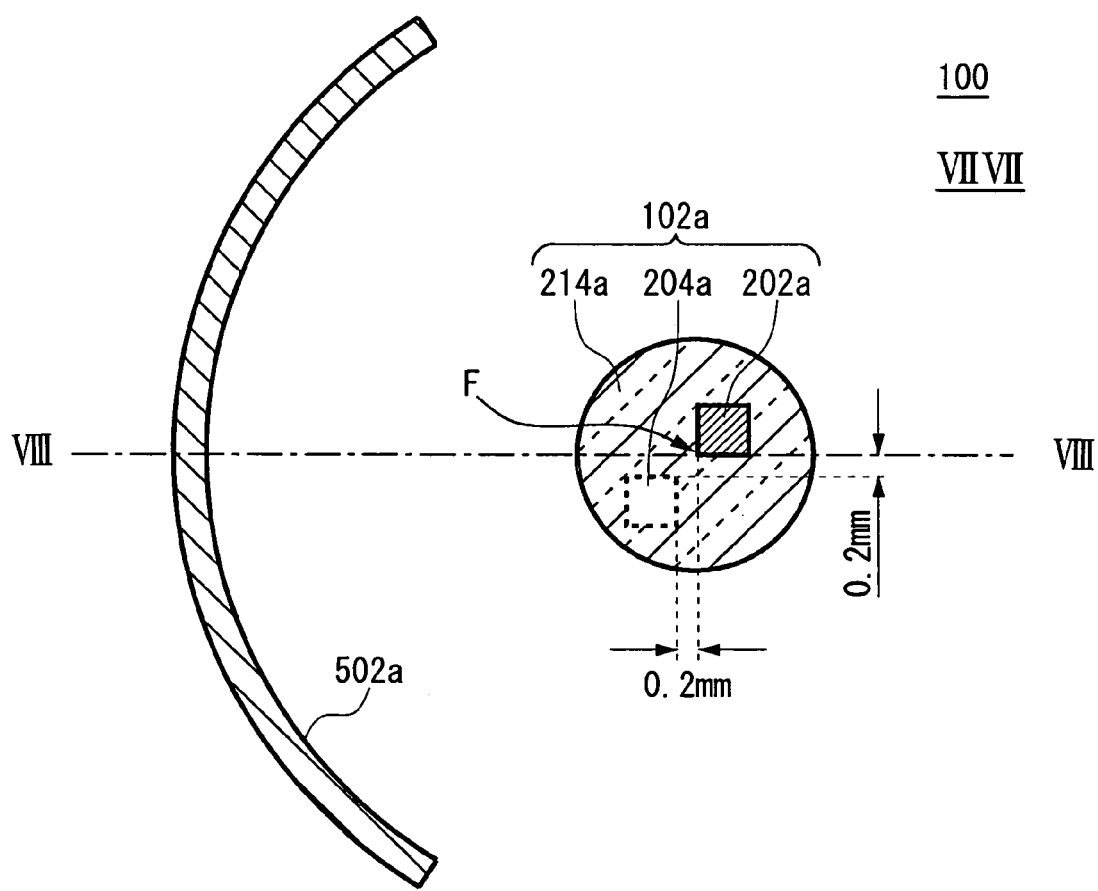
FIG. 7 is a vertical sectional view of the light source unit taken along a line VII—VII.
Figure 8:
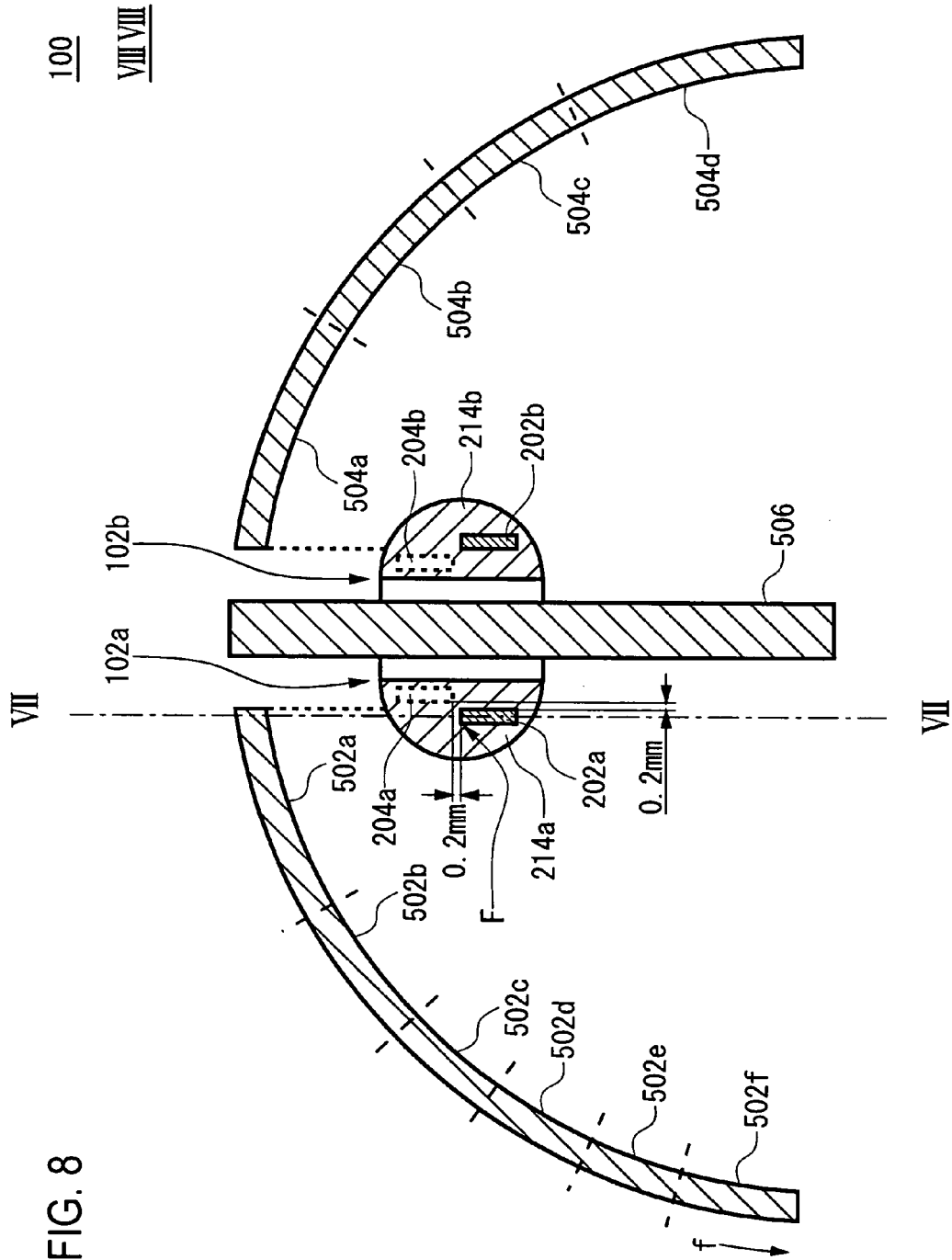
FIG. 8 is a horizontal sectional view of the light source unit taken along a line VIII—VIII.

FIGS. 6, 7, and 8 show another example of the light source unit 100. FIG. 6 is a front view of the light source unit 100, FIG. 7 is a vertical sectional view of the light source unit 100 along line VII—VII in FIGS. 6 and 8, and FIG. 8 is a horizontal sectional view of the light source unit 100 along line VIII—VIII in FIGS. 6 and 7. The light source unit 100 according to this example includes a light source retention portion 506, a plurality of light sources 102a, 102b and a plurality of reflectors 104a, 104b.

The light source retention portion 506 is a substantially flat body, with a front side and a back side which are substantially parallel to and substantially perpendicular to an optical axis of the light source unit 100, and on which the plurality of light sources 102a, 102b are respectively retained. The light source retention portion 506 retains the light source 102a and the light source 102b so that they face in the lateral direction of the vehicle, and causes light emitted by the plurality of light sources 102a, 102b to be incident on the plurality of reflectors 104a, 104b, respectively.

The light source 102a includes a visible light LED 202a, an infrared light LED 204a, and a sealing member 214a. The visible light LED 202a, the infrared light LED 204a, and the sealing member 214a have the same or similar functions as the visible light LED 202, the infrared light LED 204, and the sealing member 214 that were explained with reference to FIGS. 3 and 4.

Surfaces of the visible light LED 202a and the infrared light LED 204a are generally square shaped, with approximately 1 mm sides. As shown in FIG. 7, the infrared light LED 204a is approximately 0.2 mm to the rear of and below the visible light LED 202a in the longitudinal direction and the vertical direction of the vehicle, respectively. Moreover, as shown in FIG. 8, the infrared light LED 204a is approximately 0.2 mm closer to the reflector 104a than the visible light LED 202a in the lateral direction.

The light source 102b includes a visible light LED 202b, an infrared light LED 204b, and a sealing member 214b. The infrared light LED 204b is approximately 0.2 mm closer to the reflector 104b than the visible light LED 202b in the lateral direction. With regard to other features, since the light source 102b has the same or a similar function as the light source 102a, the explanation thereof will be omitted.

Each of the plurality of reflectors 104a, 104b is disposed so as to correspond with a respective one of the respective light sources 102a, 102b, facing one another with the light source retention portion 506 interposed therebetween. Based on the visible light emitted by the corresponding light source 102, the plurality of reflectors 104a, 104b form an oblique cut-off line and a horizontal cut-off line, respectively, in the light distribution pattern formed by the light source unit 100. The reflectors 104a, 104b may have stepped mirrored surfaces.

The reflector 104a includes a plurality of light distribution steps 502a to 502f used in the formation of an oblique cut-off line, which have an optical center F in the vicinity of the visible light LED 202a. Each of the light distribution steps 502a to 502f is a rectangular or inclined trapezoidal segmented portion of the reflector 104a, and is formed, for example, by a hyperbolic paraboloid whose shape is established in accordance with the shape of the oblique cut-off line to be formed, for example, at individual positions of a predetermined paraboloid of revolution. The hyperbolic paraboloid may have a substantially vertical cross section whose shape conforms to that of a parabola that extends in the forward direction of the light source unit 100, and a generally horizontal cross section whose shape conforms to that of a parabola that extends toward the rear of the light source unit 100, or a curved surface similar thereto.

With the foregoing structure, the reflector 104a forms a visible light pattern with a predetermined oblique cut-off line as a part of a light distribution pattern formed by the light source unit 100. Also, the reflector 104a forms an infrared light pattern based on infrared light emitted by the infrared light LED 204a.

The reflector 104b includes a plurality of horizontal cut-off line forming steps 504a to 504d, each of which is a part of the reflector 104b and has an optical center F in the vicinity of the visible light LED 202b. Each of the light distribution steps 504a to 504d is formed by a hyperbolic paraboloid which has been set in accordance with the shape of the horizontal cut-off line to be formed. With respect to other features, since the horizontal cut-off line forming light distribution steps 504 have the same or similar configuration and function as the light distribution steps for an oblique cut-off line 502, an explanation thereof will be omitted.

With the foregoing structure, the reflector 104b forms a visible light pattern with a predetermined horizontal cut-off line as a part of the light distribution pattern formed by the light source unit 100. Also, the reflector 104b forms an infrared light pattern based on infrared light emitted by the infrared light LED 204b. According to this example, an appropriate visible light pattern and infrared light pattern can be formed.

Also, it should be noted that, if lens steps for forming light distribution are provided, for example, at a front surface of the light source unit 100 or the vehicular lamp 400 in order to create the desired light distribution pattern, there are some cases where the design of the vehicular lamp would be restricted. According to this example, however, the light distribution pattern is formed by the reflectors 104a, 104b. Therefore, such lens steps are not necessary, or else more lens steps with more gradual transitions are sufficient. Therefore, according to this example, it is possible to provide a vehicular headlamp with a highly sophisticated design that offers a smooth appearance from the front surface.

Figure 9:
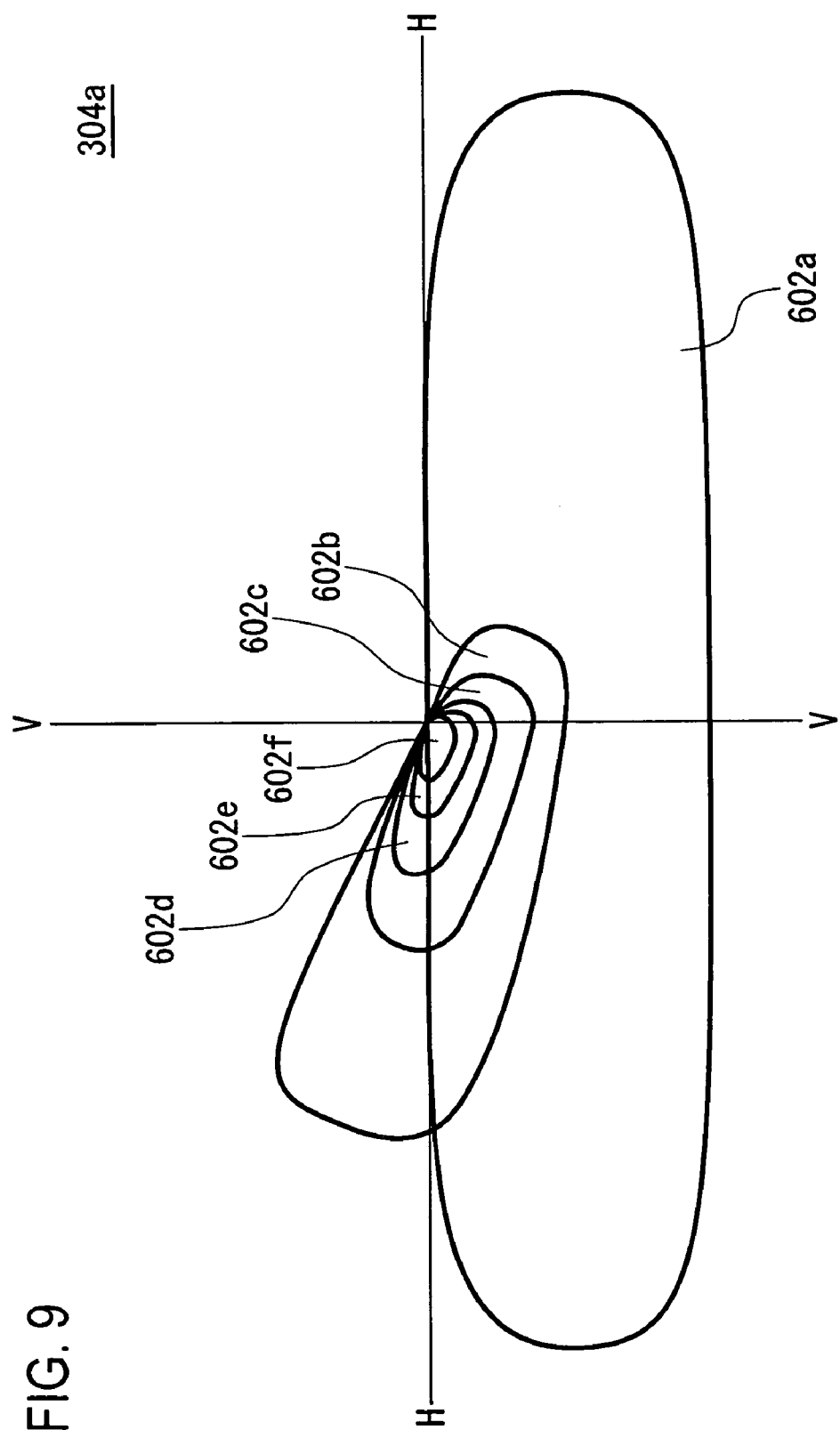
FIG. 9 is a drawing showing an example of a visible light pattern.

FIG. 9 shows an example of a visible light pattern 304a formed by the reflector 104a. In this example, the oblique cut-off line forming light distribution steps 502a to 502f form respective segmented visible light patterns 602a to 602f which contribute to the visible light pattern 304a.

The oblique cut-off line forming light distribution steps 502a forms the segmented visible light pattern 602a that spreads in the substantially horizontal direction. Further, the oblique cut-off line forming light distribution steps 502b to 502f form the segmented visible light patterns 602b to 602f, parts of which overlap with the segmented visible light pattern 602a, which spreads in a predetermined oblique direction. Accordingly, the reflector 104a forms the visible light pattern 304a with a desired predetermined oblique cut-off line.

Figure 10:
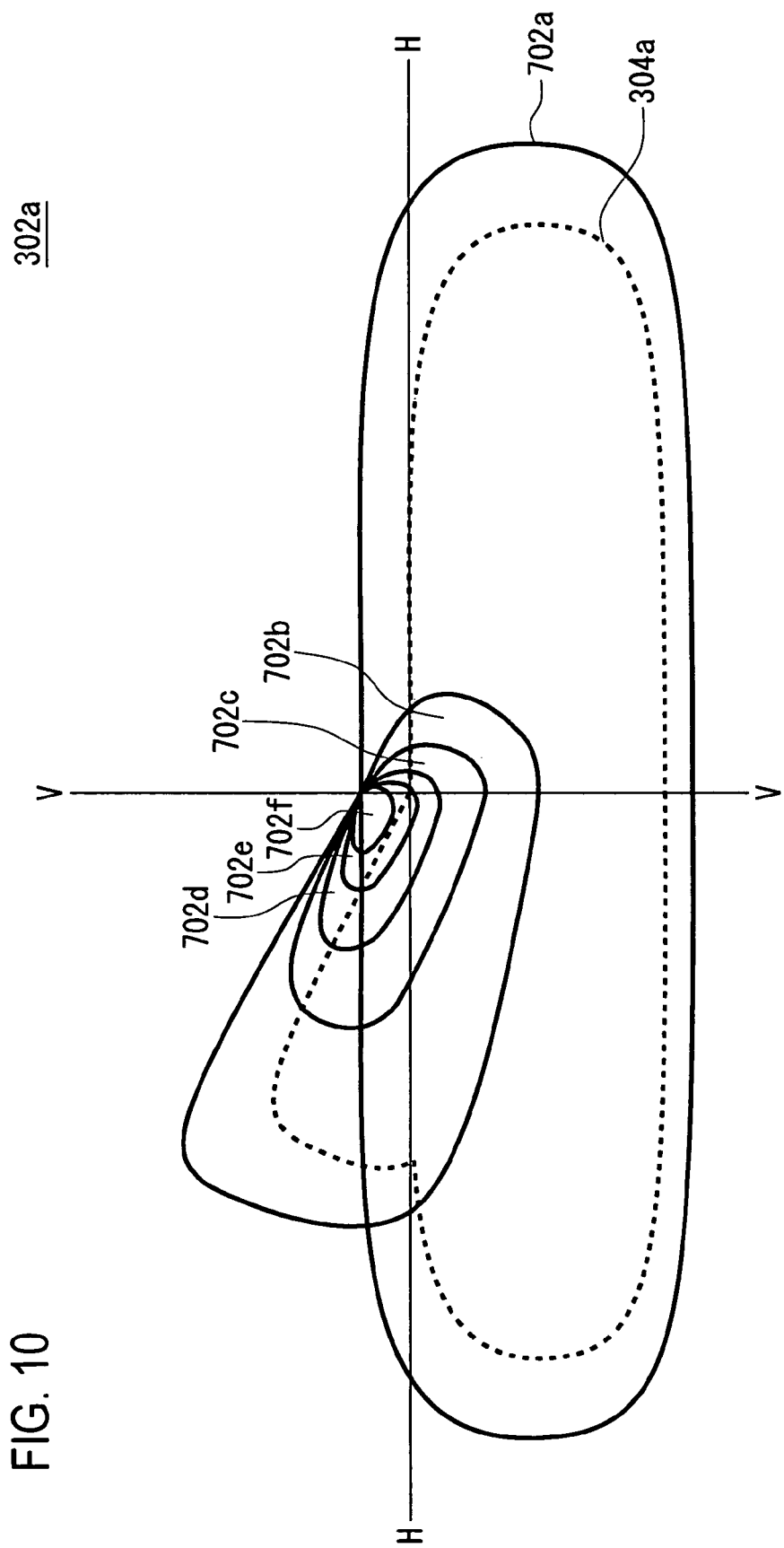
FIG. 10 is a drawing showing an example of an infrared light pattern.

FIG. 10 shows an example of an infrared light pattern 302a formed by the reflector 104a. In this example, the oblique cut-off line forming light distribution steps 502a to 502f form respective segmented infrared light patterns 702a to 702f which contribute to the infrared light pattern 302a.

In this example, the infrared light LED 204a is disposed farther than the visible light LED 202a from the optical center F of the oblique cut-off line forming light distribution steps 502a to 502f. Therefore, the oblique cut-off line forming light distribution steps 502a to 502f form the respective segmented infrared light patterns 702a to 702f, each of which spreads across a wider area than each of the segmented visible light patterns 602a to 602f (see FIG. 9). Accordingly, the infrared light pattern 302a spreads across a wider range than the visible light pattern 304a.

Figure 11:
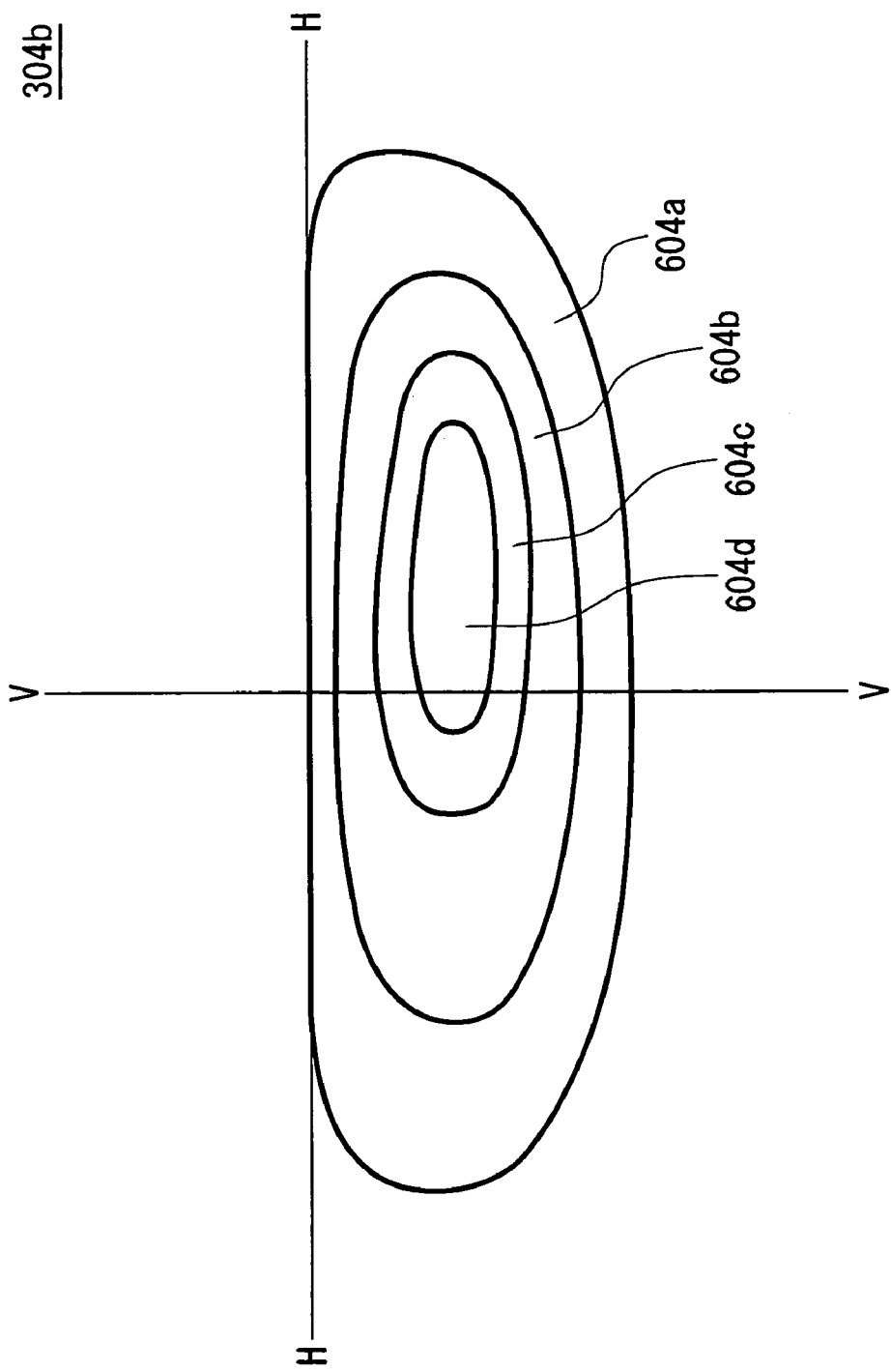
FIG. 11 is a drawing showing an example of a visible light pattern.

FIG. 11 shows an example of a visible light pattern 304b formed by the reflector 104b. In this example, the horizontal cut-off line forming light distribution steps 504a to 504d form respective segmented visible light patterns 604a to 604d, which contribute to the visible light pattern 304d. Accordingly, the reflector 104b forms the visible light pattern 304b with a desired predetermined horizontal cut-off line.

Figure 12:
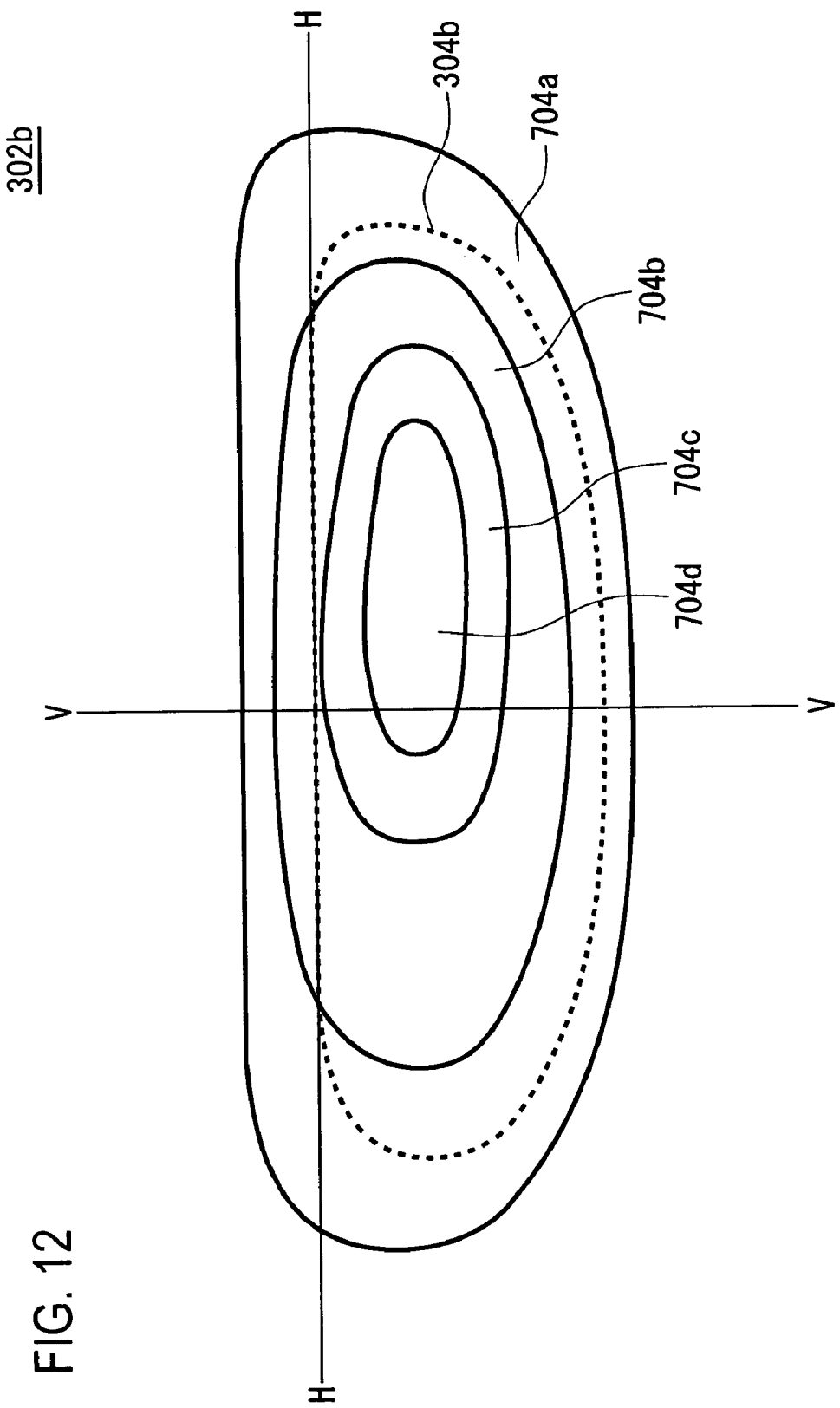
FIG. 12 is a drawing showing an example of an infrared light pattern.

FIG. 12 shows an example of an infrared light pattern 302b formed by the reflector 104b. In this example, the horizontal cut-off line forming light distribution steps 504a to 504d form respective segmented infrared light patterns 704a to 704d, which contribute to the infrared light pattern 302b.

In this example, the infrared light LED 204b is farther from the optical center F of the horizontal cut-off line forming light distribution steps 504a to 504f than the visible light LED 202b. Therefore, the horizontal cut-off line forming light distribution steps 504a to 504d form the segmented infrared light patterns 704a to 704d, each of which spreads across a wider region than the segmented visible light patterns 604a to 604d (see FIG. 11). As a result, the infrared light spreads across a wider range than the visible light pattern 304b.

It should be noted that the visible light pattern 304a, the infrared light pattern 302a, the visible light pattern 304b, and the infrared light pattern 302b that were explained with reference to FIGS. 9 to 12 are low-beam light distribution patterns which are formed on a virtual vertical screen disposed at a position 25 m ahead of the light source unit 100. Also in this example, the infrared light LED 204 and the visible light LED 202 are provided adjacent to each other. Therefore, also in this example, the red light accompanying emission of infrared light can be masked or can be made to appear dimmer because of the white light.

As explained above, the light source unit 100 radiates visible light to the region defined by the predetermined oblique cut-off line and horizontal cut-off line by forming the visible light patterns 304a, 304b. Moreover, the light source unit 100 radiates infrared light over a wider area than it radiates visible light by forming the infrared light patterns 302a, 302b. Therefore, according to this example, an appropriate light distribution pattern can be formed. Accordingly, it is possible to provide a highly advanced vehicular headlamp capable of radiating both visible light and infrared light.

As is apparent from the explanation above, a highly advanced vehicular headlamp can be provided at low cost according to the present invention.

While the present invention has been described with reference to some embodiments, the technical scope of the present invention is not so limited, and various modifications are possible. Such modifications are included in the technical scope of the present invention as defined by the claims.

What is claimed is:

1. A vehicular headlamp for use in vehicles, said headlamp comprising:
   a first semiconductor light-emitting element for emitting visible light;
   a reflector having an optical center in the vicinity of the first semiconductor light-emitting element and forming at least a part of a light distribution pattern of the vehicular head-lamp by reflecting the visible light; and
   a second semiconductor light-emitting element for emitting infrared light, said second semiconductor light-emitting element being disposed at a position different from that of the first semiconductor light-emitting element and which emits infrared light which the reflector also reflects.
   wherein the first semiconductor light-emitting element and second semiconductor light-emitting element are mounted on a single base board.

2. The vehicular headlamp according to claim 1, wherein:
   the vehicular headlamp radiates the visible light forwardly of the vehicle,
   the vehicular headlamp further includes a sealing member comprising a material that transmits the visible light and the infrared light and integrally houses and seals the first and second semiconductor light-emitting elements, and
   the reflector reflects the visible light and the infrared light forwardly of the vehicle.

3. The vehicular headlamp according to claim 2, wherein:
   the vehicular headlamp emits the infrared light at a greater elevational angle than that of the visible light.

4. The vehicular headlamp according to claim 2, further comprising a fluorescent body covering the first semiconductor light-emitting element.

5. The vehicular headlamp according to claim 4, wherein the fluorescent body comprises material with light transmission characteristics that are complementary to the light emission characteristics of the first semiconductor light-emitting element, so that substantially white light emerges from the fluorescent body.

6. The vehicular headlamp according to claim 1, wherein the reflector comprises a hyperbolic paraboloid.

7. The vehicular headlamp according to claim 1, wherein the first semiconductor light-emitting element comprises a red light-emitting diode, a green light-emitting diode, and a blue light-emitting diode, so as to enable the first semiconductor light-emitting element to emit substantially white light.

8. The vehicular headlamp according to claim 1, wherein the second semiconductor light-emitting element also emits red light near a range of the infrared light, and wherein the first and second semiconductor light-emitting elements are disposed relative to each other, and relative to the reflector, such that the only visible light coming from the headlamp is substantially white light.

9. The vehicular headlamp according to claim 1, wherein:
   the vehicular headlamp radiates the visible light forwardly of the vehicle,
   the reflector comprises a mirrored surface which extends from the rear of the first semiconductor light-emitting element in the forward direction so as to cover the first semiconductor light-emitting element for visible light, and to reflect the visible light forwardly of the vehicle, and
   the second semiconductor light-emitting element is disposed between the first semiconductor light-emitting element and a rear end of the reflector.

10. The vehicular headlamp according to claim 1, wherein:
    the second semiconductor light-emitting element is farther from the optical center of the reflector than the first semiconductor light-emitting element.

11. A light-emitting module for a headlamp for a vehicle, the module comprising:
    a first semiconductor light-emitting element for emitting visible light;
    a second semiconductor light-emitting element for emitting infrared light; and
    a sealing member which integrally houses and seals the first and second semiconductor light-emitting elements, said sealing member comprising a material that transmits both the visible light and the infrared light, such that the module emits light forwardly of the vehicle.

12. A vehicular headlamp for use in vehicles, said headlamp comprising at least two light-emitting modules, each of said modules comprising:
    a first semiconductor light-emitting element for emitting visible light;
    a second semiconductor light-emitting element for emitting infrared light; and
    a sealing member which integrally houses and seals the first and second semiconductor light-emitting elements, said sealing member comprising a material that transmits both the visible light and the infrared light, such that the module emits light forwardly of the vehicle.

13. The vehicular headlamp according to claim 12, further comprising a substantially flat light retention portion having the first and second light-emitting modules disposed respectively on opposing substantially flat surfaces thereof, and respective first and second pluralities of reflectors for reflecting light emitted from the respective first and second light-emitting modules.

14. The vehicular headlamp according to claim 13, wherein the first and second pluralities of reflectors comprise respective pluralities of stepped mirrored surfaces, providing respective pluralities of light distribution steps for light emitted by the respective first and second light-emitting modules.

15. The vehicular headlamp according to claim 13, wherein, in each of said first and second light-emitting modules, the second semiconductor light-emitting element is farther from the optical center of its respective reflector than is the first semiconductor light-emitting element.

16. The vehicular headlamp according to claim 1, wherein the reflector reflects the visible light and the infrared light forwardly of the vehicle.

17. The vehicular headlamp according to claim 1, wherein the second semiconductor light-emitting element is arranged with respect to the first semiconductor light-emitting element and the reflector so that the vehicular headlamp emits infrared light over a larger area than visible light.

18. The vehicular headlamp according to claim 1, further comprising a sealing member which integrally houses and seals the first and second semiconductor light-emitting elements.

19. The vehicular headlamp according to claim 18, wherein the sealing member is constructed of a material that transmits visible light and infrared light, and fills a volume between the first semiconductor light-emitting element and the second semiconductor light-emitting element.

20. The vehicular headlamp according to claim 2, wherein the sealing member fills a volume between the first semiconductor light-emitting element and the second semiconductor light-emitting element.

* * * * *